United States Patent [19]

Talisa et al.

[11] Patent Number: 5,747,873
[45] Date of Patent: May 5, 1998

[54] TECHNIQUE FOR FABRICATING HYBRID HIGH-TEMPERATURE SUPERCONDUCTOR-SEMICONDUCTOR CIRCUITS

[75] Inventors: Salvador H. Talisa, Edgewood; Michael A. Janocko, Monroeville; Deborah P. Partlow, Export, all of Pa.; Andrew J. Piloto, Columbia, Md.

[73] Assignee: Northrop Grumman Corporation, Los Angeles, Calif.

[21] Appl. No.: 721,927

[22] Filed: Sep. 27, 1996

[51] Int. Cl.$^6$ .................................................. H01L 39/00
[52] U.S. Cl. .......................... 257/661; 257/662; 257/663; 257/700; 257/703; 505/191; 505/220; 505/238
[58] Field of Search ........................... 257/661, 662, 257/663, 703, 31–35, 700; 505/191, 220, 238

[56] References Cited

U.S. PATENT DOCUMENTS

| | | | |
|---|---|---|---|
| 4,642,148 | 2/1987 | Kurihara et al. | 156/89 |
| 4,764,357 | 8/1988 | Sherif et al. | 501/12 |
| 4,883,521 | 11/1989 | Shimizu et al. | 501/12 |
| 4,936,317 | 6/1990 | MacGregor | 128/784 |
| 4,943,425 | 7/1990 | Su et al. | 423/338 |
| 4,978,640 | 12/1990 | Kelly | 501/32 |
| 5,075,283 | 12/1991 | De | 505/1 |
| 5,128,284 | 7/1992 | Olson et al. | 501/12 |
| 5,175,199 | 12/1992 | Asano et al. | 523/444 |
| 5,283,465 | 2/1994 | Yamazaki | 257/663 |
| 5,596,206 | 1/1997 | Yamazaki | 257/30 |

OTHER PUBLICATIONS

M.D. Sacks et al., "Preparation of SiO$_2$ Glass from Model Powder Compacts: I, Formation and Characterization of Powders, Suspensions, and Green Compacts," J. Am. Ceram. Soc., 67 [8], pp. 526–532 (1984).

M.D. Sacks et al., "Preparation of SiO$_2$ Glass from Model Powder Compacts: II, Sintering," J. Am. Ceram. Soc., 67 [8] pp. 532, 537 (1984).

Stober et al., "Controlled Growth of Monodisperse Silica Spheres in the Micron Size Range," J. Colloid Interface Soc., vol. 26, pp. 62–69 (1968).

L. E. Sanchez, "Electrical, Mechanical and Thermal Characterization of a Cofired, Multilayer Substrate Processed From Sol–Gel Silica", Ceram. Eng. Sci. Proc. 9 [11–12] pp. 1590–1602 (1988).

C. Frondel, The System of Mineralogy: vol. III Silica Minerals, "Cristobalite", John Wiley & Sons, Inc. New York, p. 273 (1962).

Yoldas, B.E., "Preparation of Glasses and Ceramics from Metal–Organic Compounds", J. Mat. Sc., 12, 1203 (1977).

Primary Examiner—Mahshid D. Saadat
Assistant Examiner—Allan R. Wilson
Attorney, Agent, or Firm—Walter G. Sutcliff

[57] ABSTRACT

A system for incorporating superconductor circuits and semiconductor circuits in multilayered structures. A carrier material is chosen that is a good thermal match with the preferred superconductor substrates. The preferred superconductor substrate materials are lanthanum aluminate, magnesium oxide and neodymium gallate. The substrate carrier material should provide adequate thermal match through the range of operating temperatures which are preferably from room temperature to 77K. The preferred carrier material is a low temperature cofired ceramic (LTCC) which allows for multilayered structures to be developed which incorporate the superconductor circuitry and the semiconductor elements. The LTCC is composed of crystalline quartz particles in a borosilicate glass matrix. The percentage of quartz may be adjusted to adjust the thermal expansion characteristics of the LTCC.

9 Claims, 3 Drawing Sheets

TECHNIQUE FOR FABRICATING HYBRID HIGH-TEMPERATURE SUPERCONDUCTOR-SEMICONDUCTOR CIRCUITS

BACKGROUND OF THE INVENTION

1. Field of the Invention

This invention relates generally to technique for fabricating microwave frequency circuits. More particularly the invention relates to techniques for fabricating superconductor hybrid circuits.

2. Description of the Prior Art

In order to use microwave and digital superconducting circuitry in a system, it is necessary to place it in a housing in which it might be electrically connected to conventional semiconductor (e.g., silicon or gallium arsenide) circuitry. This is because superconducting components are usually restricted to where high speed or low resistivity are required, whereas other important device functions such as amplification and microwave signal switching are accomplished more effectively by conventional semiconductor circuits. Thus, a system will often require to have semiconductor chips used in combination with superconducting circuitry. The superconductive circuitry usually comprises superconducting Josephson junctions and lines fabricated from crystalline layers deposited by vacuum techniques on special single-crystal substrates and fabricated using photolithographic techniques. In order to provide suitable electrical circuitry, semiconductor circuit chips must often be placed side by side with superconducting chips and be interconnected to one another with gold wire bonds on the top side and through a common ground plane on the underside.

No established technology exists today for the packaging of complex superconductor-semiconductor hybrid circuits, which requires the housing and interconnection of superconducting and semiconducting chips. Therefore, the package must provide electrical, mechanical and thermal stability at the required cryogenic operating temperature (typically 77K).

Therefore, a technique that allows multi-layering of the superconductor and semiconductor circuitry would be advantageous. Such a technique should ensure an adequate matching of the thermal characteristics of the materials utilized in the package at the cryogenic operating temperature, so that mechanical failure is avoided during thermal cycling to room temperature, when the system is not operational.

SUMMARY OF THE INVENTION

A multilayered packaging system is provided for incorporating and electrically interacting superconductor circuits and semiconductor circuits among themselves and to the exterior of the system. The packaging system thus includes substrate material for the superconductor as well as having material upon which circuitry is mounted. The preferred superconductor substrates are lanthanum aluminate, magnesium oxide and neodymium gallate. Superconducting chips on substrates of these materials and semiconducting chips are mounted adjacent one another on the same material in the same housing. The preferred housing material is a low temperature co-fired ceramic (LTCC) composed of crystalline quartz particles in a borosilicate glass matrix.

Both semiconducting circuitry and the superconducting circuitry made on either neodymium gallate, magnesium oxide or lanthanum aluminate are thermal-expansion-compatible with the LTCC material from room temperature down to the cryogenic operating temperature. Thus, using LTCC as the mounting material for both the superconductor and the semiconductor results in a mechanically sound structure that holds together during thermal cycling. The semiconducting circuitry referred to in this invention is such as to provide satisfactory operation at cryogenic temperatures.

Other objects and advantages of the invention will become apparent from a description of certain present preferred embodiments thereof shown in the drawings.

DETAILED DESCRIPTION OF THE PREFERRED EMBODIMENTS

Figure 1:
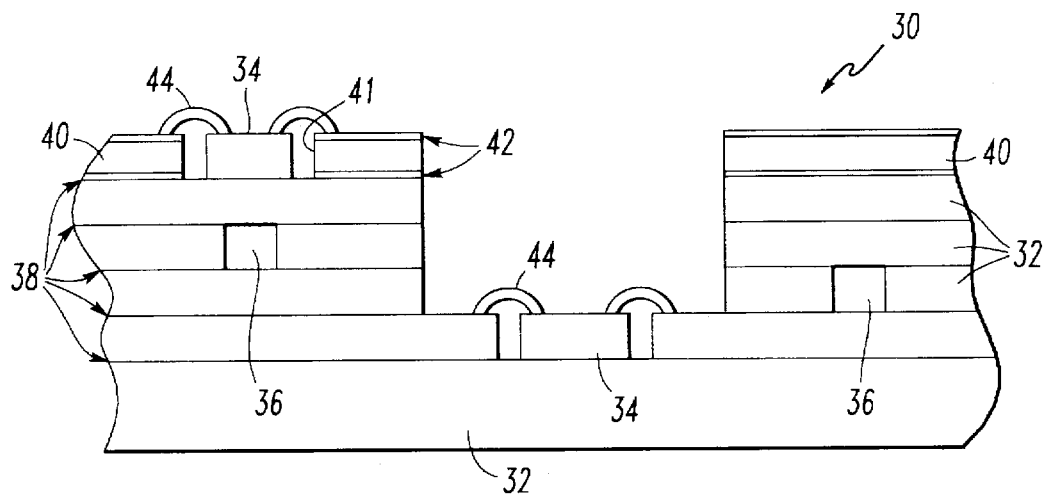
FIG. 1 is a schematic diagram of the present system for incorporating superconductor circuits and semiconductor circuits in multilayered structures.

Referring to FIG. 1, a system 30 is shown for incorporating superconductor circuits and semiconductor circuits in a multilayered structure. In the present invention, materials are chosen as the superconductor substrates, the superconductor carrier and the semiconductor devices so that the entire assembly may physically withstand the effects of thermal expansion and contraction through the operating temperatures of the assembly.

The preferred superconductor substrate 40 materials are lanthanum aluminate ($LaAlO_3$), magnesium oxide (MgO) and neodymium gallate ($NdGaO_3$). Other suitable superconductor substrate 40 materials include aluminum oxide and strontium aluminum tantalate. The preferred carrier material 32 is a low temperature co-fired ceramic (LTCC). The substrate-carrier pair 40, 32 are selected and/or modified so as to have matched thermal contractions. The composition of the LTCC could be adjusted to match the thermal contraction of the suitable superconducting substrate at 77K.

Figure 2:
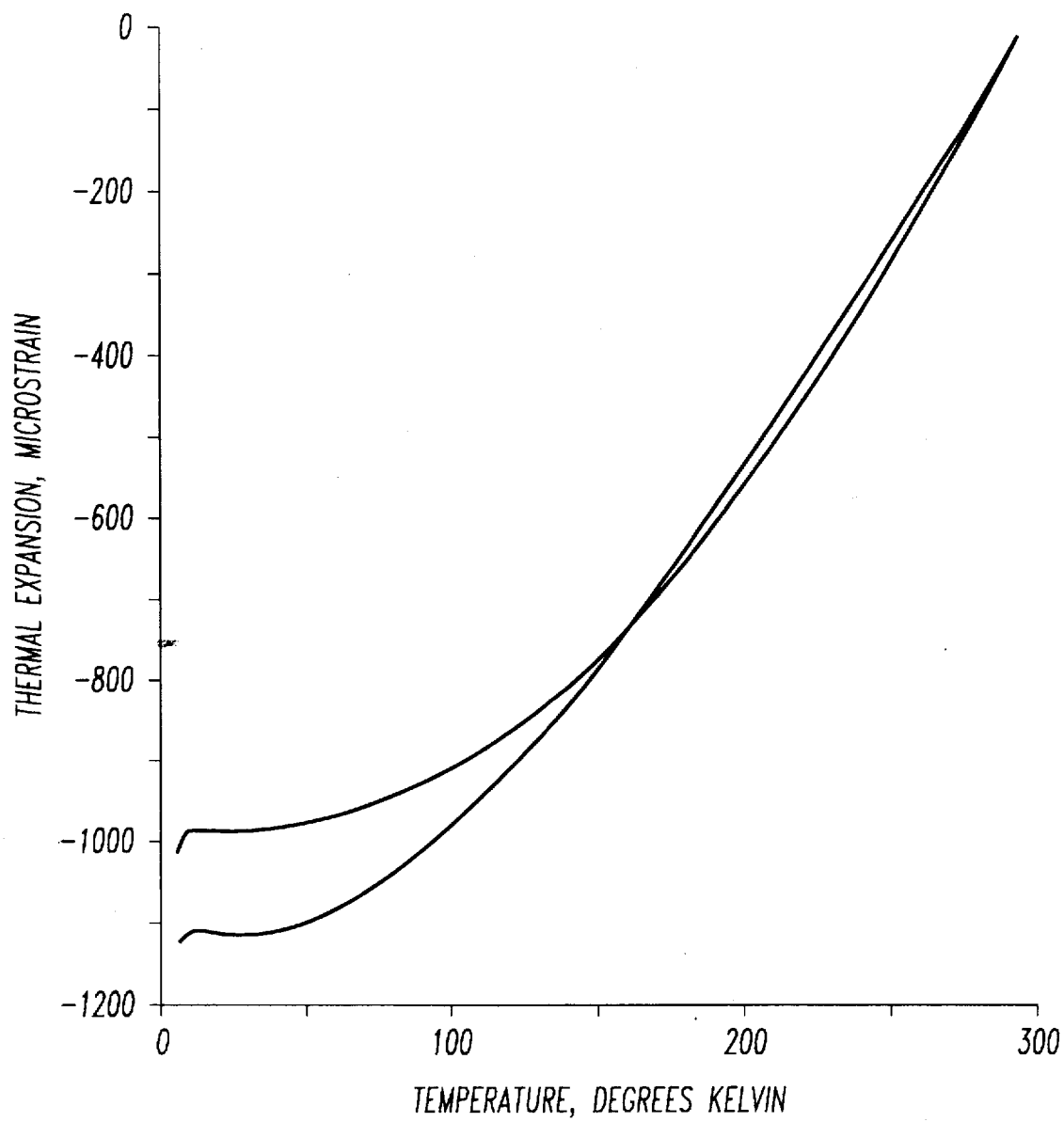
FIG. 2 is a graphical representation of measured thermal expansion versus temperature for the preferred low temperature cofired ceramic material (LTCC) and for a preferred superconductor substrate material, neodymium gallate.

Referring to FIG. 2, a graphical representation of the thermal expansion characteristics over a range of temperatures is shown of one such superconducting substrate, neodymium gallate, and the LTCC. The composition of the LTCC represented in FIG. 2 is: 35 volume percent crystalline quartz powder and 65 volume percent borosilicate glass, the latter consisting of 21 weight percent $B_2O_3 \pm 2\%$ with the remaining weight percent of the glass being $SiO_2$.

Figure 3:
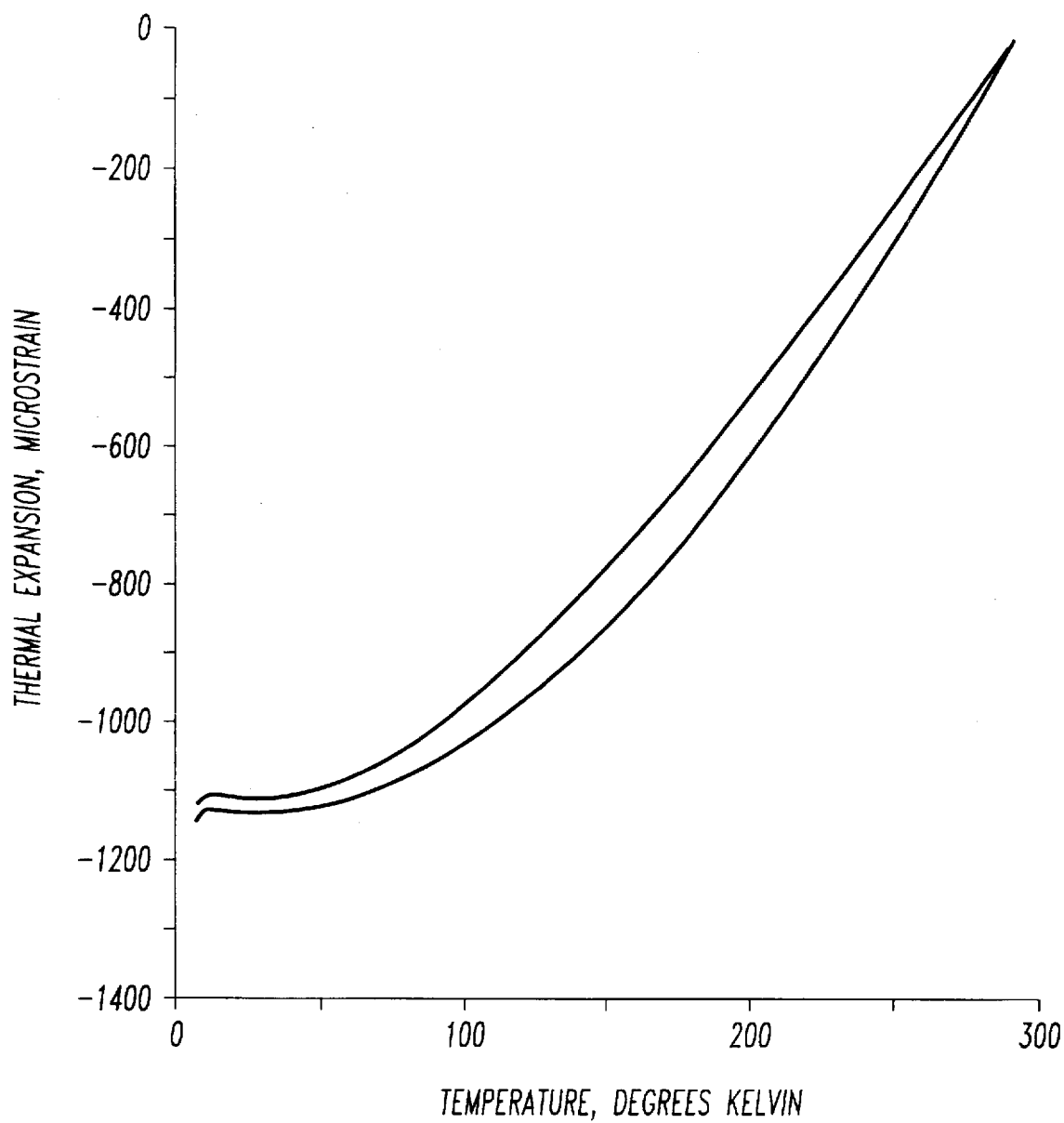
FIG. 3 is a graphical representation of measured thermal expansion versus temperature for the preferred low temperature cofired ceramic material (LTCC) and for a preferred superconductor substrate material, lanthanum aluminate.

Referring next to FIG. 3, a graphical representation of the thermal expansion characteristics over a range of temperatures is shown of another such superconducting substrate, lanthanum aluminate, and the LTCC. The LTCC composition in FIG. 3 is the same as that in FIG. 2. This material was also experimentally demonstrated to be compatible with silicon substrates. If a slightly different thermal expansion is required for compatibility with other substrates the percentage of quartz in the LTCC can be adjusted. Higher quartz contents provide higher thermal expansion.

By using low-temperature co-fired ceramic (LTCC) as the matched carrier to the superconductor substrate material (such as LaAlO$_3$), a multilayered circuit could be made for operation at 77K in which all vias such as 36 and all the metallization layers 38 below the surface are gold for low-Q circuits and interconnects. At the surface, however, the superconductor substrate material could be placed, with windows 41 provided in it through which microwave and digital integrated semiconductor circuit elements 34 could be dropped onto the carrier material 32 and electrically connected by means of gold wire bonds 44.

As is also illustrated in FIG. 1, the semiconductor chips 34 could be placed upon the carrier material 32 level with any of the conductive layers 38 underneath the surface. Metallic materials currently in use to mount the superconductor substrate material do not allow this multi-layering. A multi-layering capability is an advantage with circuits of high complexity because semiconductor chips require bias control lines whose arrangement and layout is more effective when layering is possible. Providing bias lines, controls and circuit connections in a system that does not allow for layering requires an operator to machine the metallic package to provide openings for wires to serve as the bias and control lines for each such element, which is expensive and complicated. When using metallic substrates, the circuit is not multi-layered, that is, the entire device has to be planar, with different elements provided in different compartments, all in the same plane. The flexibility and efficiency of multilayered packaging is absent when using metallic housings.

The lanthanum aluminate substrate 40 which supports the superconducting circuitry 42 is placed on a metallized ceramic carrier 32 that is a low-temperature cofired ceramic (LTCC). Use of a low-temperature ceramic as the carrier material 32 allows the use of gold, silver, or copper as the metallization 38, rather than the higher resistive tungsten or molybdenum used in higher-firing ceramics.

The preferred way to tailor the thermal expansion of the carrier material 32 so as to achieve a thermal expansion match between the superconductor substrate material 40 and the ceramic carrier material 32 is to mix a pre-determined amount of crystallized silica in the form of alpha-quartz in with the glass when fabricating the ceramic. The amount of quartz is determined by the desired thermal expansion. Up to 50 volume percent of the LTCC can be quartz, approximately doubling the thermal expansion of LTCC.

Lanthanum aluminate, magnesium oxide and neodymium gallate are preferably used as the substrate material 40 for yttrium-barium-copper-oxide (YBCO) superconducting circuits 42 that operate at liquid nitrogen temperatures (77K), and silicon is used as a substrate for the niobium metal superconducting circuits that operate at lower temperatures (as low as liquid helium 4K). Other materials may be used for superconducting circuits, such as thallium-barium-copper-oxide. In addition, silicon and gallium arsenide semiconducting devices will typically be used in hybrid constructions in conjunction with superconductors at cryogenic temperatures typically above 50K. Other semiconductor materials, such as indium phosphide, silicon carbide, silicon germanium and gallium nitrite, may also be used. These devices may all be mounted in the same ceramic carrier material due to the thermal expansion characteristics of the LTCC.

The ceramic carrier material can be used both with superconducting substrates and with semiconducting chips because all of these non-metallic materials display a relatively low thermal expansion below room temperature; in essence their thermal expansion curves flatten out and converge under cryogenic conditions.

Furthermore, the semiconductor chips are expected to be small in area, i.e., a few square millimeters, compared to the superconductor substrates. Thus, by matching the LTCC carrier to the superconducting substrates and minimizing the strain due to slight mismatch with semiconducting chips because of their small area, thermal and mechanical stability of the entire assembly is achieved at the operating cryogenic temperature.

The lower metallization layers can be made of thick film YBCO. This may be desirable in those cases for which an improvement in performance could be obtained from lower loss in the conductor and is not limited by losses in the dielectric. Thus, the critical low loss circuitry, such as filters and manifolds, could be placed on the top surface using epitaxial YBCO on LaAlO$_3$, while less critical parts of the subsystem could be made directly on the LTCC material where the loss in the thick film YBCO is higher than epitaxial YBCO but still lower than gold. Advantage would still be taken of windows in the LaAlO$_3$ substrate to place MMIC chips at any level needed in the assembly.

Figure 4:
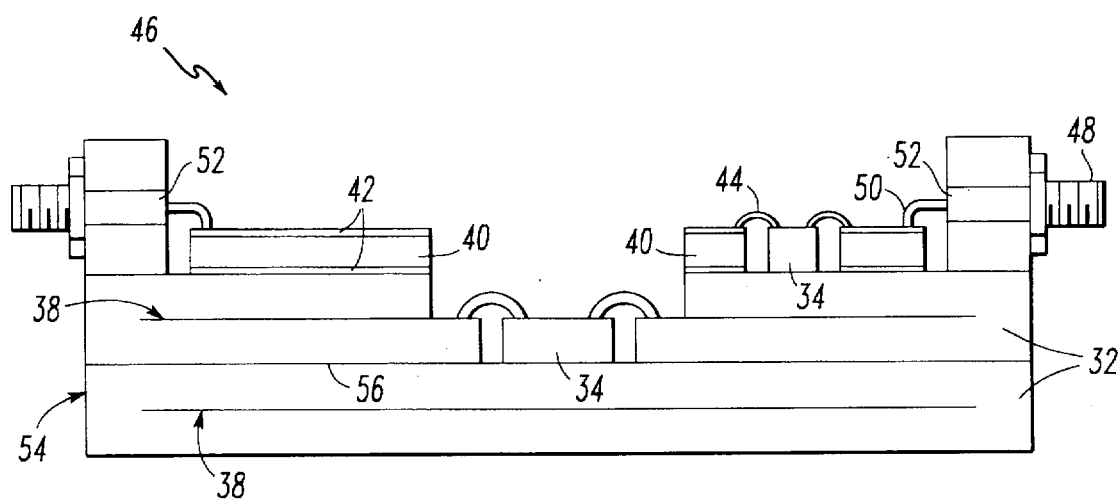
FIG. 4 is a schematic diagram showing a low temperature co-fired ceramic material as the carrier for an entire package of an electronic assembly.

The LTCC carriers may be made to be the entire package 46 for the assembly as illustrated in FIG. 4. Such a configuration would provide a custom made, light weight assembly containing an entire subsystem suitable for cryogenic operation. Feedthrough holes 52 for a coaxial connector 48 could be fabricated through the LTCC carrier material 32 to place coaxial-to-microstrip transitions 50. The package 46 would preferably include conductive plating 54, preferably gold plating. Ground plane 56 may be included in the assembly which would be in contact with gold plated exterior 54 of the package 46. As noted with reference to FIG. 1, the package 46 may have semiconductor components 34 and superconductor substrates 40 having superconductor circuitry 42 thereupon. Devices and subsystems could be built in this fashion, taking advantage of HTS and semiconductor technologies to produce high performance low-loss systems.

EXAMPLES

A 2-inch diameter wafer of lanthanum aluminate was attached using indium solder to a gold ground plane that had been cofired onto a block of LTCC material. (A similar test was performed using a conductive epoxy for attachment.) The particular variety of LTCC was the one designed to match gallium arsenide in thermal expansion from room temperature to about 500° C. The composition of the LTCC is 35 volume percent crystalline quartz powder and 65 volume percent borosilicate glass, the latter consisting of 21 weight percent B$_2$O$_3$±2% with the remaining weight percent of the glass being SiO$_2$. The lanthanum aluminate/LTCC bonded sandwiches were then plunged repeatedly into liquid nitrogen to test for survivability under thermal shock. The wafers remained intact.

Another thermal shock test was run with a silicon wafer mounted using 2-mil thick conductive epoxy on the same LTCC. This time the test was done using liquid helium. Again, the wafer remained intact.

These test results show that the LTCC material can be used as a carrier for superconducting circuitry as well as conventional devices of Si or GaAs.

While certain present preferred embodiments have been shown and described, it is distinctly understood that the invention is not limited thereto to but may be otherwise embodied within the scope of the following claims.

What is claimed is:

1. An electronic device assembly, comprising:
   at least one semiconductor component;
   at least one superconductor component which includes substrate material and superconducting material provided on the substrate material;
   a low temperature cofireable ceramic material having at least one metalization layer contained within the body of said low temperature cofireable ceramic material; and
   wherein the low temperature cofireable ceramic material serves as both a substrate carrier for the superconductor substrate material as well as a mounting material for the at least one semiconductor component.

2. The device assembly of claim 1 wherein the at least one superconductor component and the at least one semiconductor component are mounted directly upon a single low temperature cofirable ceramic material.

3. The device of claim 1 which includes a plurality of metalization layers contained within the body of said low temperature cofireable ceramic material and at least one of said metallization layers is made using thick film techniques deposited directly on the low temperature cofireable ceramic material.

4. The device assembly of claim 1 wherein the at least one semiconductor component is comprised of at least one material selected from the group consisting of silicon, gallium arsenide, indium phosphide, silicon carbide, silicon germaniun and gallium nitride.

5. The device assembly of claim 1 wherein the at least one superconductor component includes at least one substrate material selected from the group consisting of lanthanum aluminate, neodymium gallate, magnesium oxide, aluminum oxide, and strontium aluminum tantalate.

6. The device assembly of claim 1 wherein the at least one superconductor component is made of at least one superconducting material selected from the group consisting of yttrium barium copper oxide and thallium barium calcium copper oxide.

7. The device assembly of claim 1 wherein the low temperature cofirable ceramic is comprised of crystalline quartz particles in a borosilicate glass matrix.

8. The device assembly of claim 7 wherein the low temperature cofirable ceramic has a composition of substantially 65 volume percent borosilicate glass and substantially 35 volume percent crystalline quartz powder.

9. The device assembly of claim 8 wherein the borosilicate glass has composition of substantially 21 weight percent boron trioxide ±2% and substantially 79 weight percent silicon dioxide.

* * * * *